(12) United States Patent
Yang et al.

(10) Patent No.: US 9,362,718 B2
(45) Date of Patent: Jun. 7, 2016

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jong In Yang, Suwon-si (KR); Seung Hwan Lee, Suwon-si (KR); Hyun Kwon Hong, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/154,448

(22) Filed: Jan. 14, 2014

(65) Prior Publication Data

US 2014/0219303 A1    Aug. 7, 2014

(30) Foreign Application Priority Data

Feb. 1, 2013    (KR) .................. 10-2013-0011832

(51) Int. Cl.
*H01L 33/00*    (2010.01)
*H01S 5/20*    (2006.01)
*H01L 33/38*    (2010.01)
*H01L 33/22*    (2010.01)
*H01L 33/44*    (2010.01)
*H01L 33/48*    (2010.01)

(52) U.S. Cl.
CPC ............... *H01S 5/20* (2013.01); *H01L 33/382* (2013.01); *H01L 33/0079* (2013.01); *H01L 33/22* (2013.01); *H01L 33/44* (2013.01); *H01L 33/486* (2013.01); *H01L 2924/0002* (2013.01)

(58) Field of Classification Search
CPC ........ H01L 33/38–33/387; H01L 33/20–33/24
USPC ...................................... 257/79–103
See application file for complete search history.

(56) References Cited

U.S. PATENT DOCUMENTS

| 7,964,881 | B2 | 6/2011 | Choi et al. | |
|---|---|---|---|---|
| 2008/0191215 | A1 | 8/2008 | Choi et al. | |
| 2010/0078656 | A1* | 4/2010 | Seo et al. | 257/88 |
| 2010/0258822 | A1* | 10/2010 | Kobayashi | 257/88 |
| 2011/0024776 | A1* | 2/2011 | Kim | H01L 33/145 257/94 |

(Continued)

FOREIGN PATENT DOCUMENTS

| JP | 2008-103600 A | 5/2008 |
|---|---|---|
| KR | 10-0878434 B1 | 1/2009 |

(Continued)

*Primary Examiner* — Mohsen Ahmadi
*Assistant Examiner* — Frederick B Hargrove
(74) *Attorney, Agent, or Firm* — Lee & Morse, P.C.

(57) ABSTRACT

A semiconductor light emitting device includes a light emitting structure including a first conductivity type semiconductor layer, an active layer, and a second conductivity type semiconductor layer, a first electrode disposed below the light emitting structure, the first electrode being electrically connected to the first conductivity type semiconductor layer, a second electrode within the light emitting structure, the second electrode being electrically connected to the second conductivity type semiconductor layer, an insulating part electrically separating the second electrode from the first conductivity type semiconductor layer, the active layer, and the first electrode, a first pad electrode electrically connected to the first electrode, and a second pad electrode electrically connected to the second electrode, the second pad electrode being exposed to a top surface of the light emitting structure.

19 Claims, 11 Drawing Sheets

(56) References Cited

U.S. PATENT DOCUMENTS

| | | |
|---|---|---|
| 2011/0049555 A1* | 3/2011 | Engl et al. ................ 257/98 |
| 2011/0272666 A1* | 11/2011 | Hung et al. .............. 257/13 |
| 2012/0007101 A1 | 1/2012 | Yang et al. |
| 2012/0007118 A1* | 1/2012 | Choi et al. ................ 257/98 |
| 2012/0018734 A1* | 1/2012 | Chae et al. ................ 257/76 |
| 2012/0018764 A1 | 1/2012 | Choi et al. |
| 2012/0043575 A1* | 2/2012 | Kim et al. ................ 257/98 |
| 2012/0181546 A1* | 7/2012 | Tu ............................ 257/76 |
| 2013/0075771 A1* | 3/2013 | Fujimoto et al. ......... 257/96 |

FOREIGN PATENT DOCUMENTS

| | | |
|---|---|---|
| KR | 10-2010-0024855 A | 3/2010 |
| KR | 10-2011-0138839 A | 12/2011 |

* cited by examiner

SEMICONDUCTOR LIGHT EMITTING DEVICE

CROSS-REFERENCE TO RELATED APPLICATION

Korean Patent Application No. 10-2013-0011832, filed on Feb. 1, 2013, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

In general, nitride semiconductors are widely used in green or blue light emitting diodes (LEDs) or laser diodes (LDs) provided as light sources in, e.g., full-color display devices, image scanners, various signaling devices, and optical communications devices. Such a nitride semiconductor light emitting device may be provided as a light emitting device including an active layer emitting light of various colors including blue light and green light through recombination of electrons and holes.

With the extension of the applications of nitride semiconductor light emitting devices, research into light sources for general lighting devices and vehicles is being actively conducted. In recent years, research has been extended to high current/high output products using light emitting devices. Therefore, research into improvements of semiconductor light emitting devices in terms of light emitting efficiency and quality is being actively conducted. In particular, light emitting devices having various electrode structures are being developed in order to improve light output and reliability thereof.

SUMMARY

An aspect of embodiments provides a semiconductor light emitting device capable of improving light extraction efficiency by significantly reducing the loss of light.

According to an aspect of the embodiments, there is provided a semiconductor light emitting device including a light emitting structure including a first conductivity type semiconductor layer, an active layer and a second conductivity type semiconductor layer, a first electrode disposed below the light emitting structure and electrically connected to the first conductivity type semiconductor layer, a second electrode disposed within the light emitting structure and electrically connected to the second conductivity type semiconductor layer, an insulating part electrically separating the second electrode from the first conductivity type semiconductor layer, the active layer and the first electrode, a first pad electrode electrically connected to the first electrode, and a second pad electrode electrically connected to the second electrode and exposed to a top surface of the light emitting structure.

The first pad electrode and the second pad electrode may be disposed in opposite directions based on the active layer.

The first electrode and the second electrode may be disposed in opposite directions based on the active layer.

The second electrode may be embedded within the second conductivity type semiconductor layer.

A bottom surface of the second electrode may be spaced apart from a top surface of the active layer.

The second electrode may be formed as lines extended in rows and columns.

The rows and columns of the second electrode may be connected to one another within the light emitting structure.

The second pad electrode may be disposed on a portion of the second electrode.

A width of the second pad electrode may be greater than a width of the second electrode.

The insulating part may penetrate through the first conductivity type semiconductor layer and the active layer and be connected to the second electrode.

The insulating part may cover at least part of bottom and lateral surfaces of the second electrode.

The semiconductor light emitting device may further include a conductive substrate disposed below the first electrode, and the first pad electrode may be disposed below the conductive substrate The light emitting structure may include a first unevenness structure formed on the top surface thereof.

The light emitting structure may include a second unevenness structure formed on a top surface thereof, the second unevenness structure having a convex portion larger than a convex portion of the first unevenness structure.

A distance between an upper surface of the second electrode and the first electrode may be smaller than a distance between an upper surface of the light emitting structure and the first electrode, the upper surface of the second electrode and the light emitting structure facing a same direction.

A portion of the light emitting structure may cover an entire upper surface of the second electrode, the upper surface of the second electrode facing away from the first electrode.

According to another aspect of the embodiments, there is provided a semiconductor light emitting device including a light emitting structure including a first conductivity type semiconductor layer, an active layer and a second conductivity type semiconductor layer sequentially stacked, a first electrode electrically connected to the first conductivity type semiconductor layer, a second electrode disposed within the light emitting structure and electrically connected to the second conductivity type semiconductor layer, a first pad electrode electrically connected to the first electrode, and a second pad electrode electrically connected to the second electrode and exposed to a light emitting surface of the light emitting structure.

According to another aspect of the embodiments, there is provided a semiconductor light emitting device, including a light emitting structure including a first conductivity type semiconductor layer, an active layer, and a second conductivity type semiconductor layer, a first electrode electrically connected to the first conductivity type semiconductor layer, a second electrode having an upper surface within the light emitting structure and spaced apart from an upper surface of the light emitting structure, the second electrode being electrically connected to the second conductivity type semiconductor layer, an insulating part electrically separating the second electrode from the first conductivity type semiconductor layer, the active layer, and the first electrode, a first pad electrode electrically connected to the first electrode, and a second pad electrode electrically connected to the second electrode, the second pad electrode being exposed to a top surface of the light emitting structure.

The second electrode may be embedded within the second conductivity type semiconductor layer.

A portion of the second conductivity type semiconductor layer may cover the upper surface of the second electrode.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
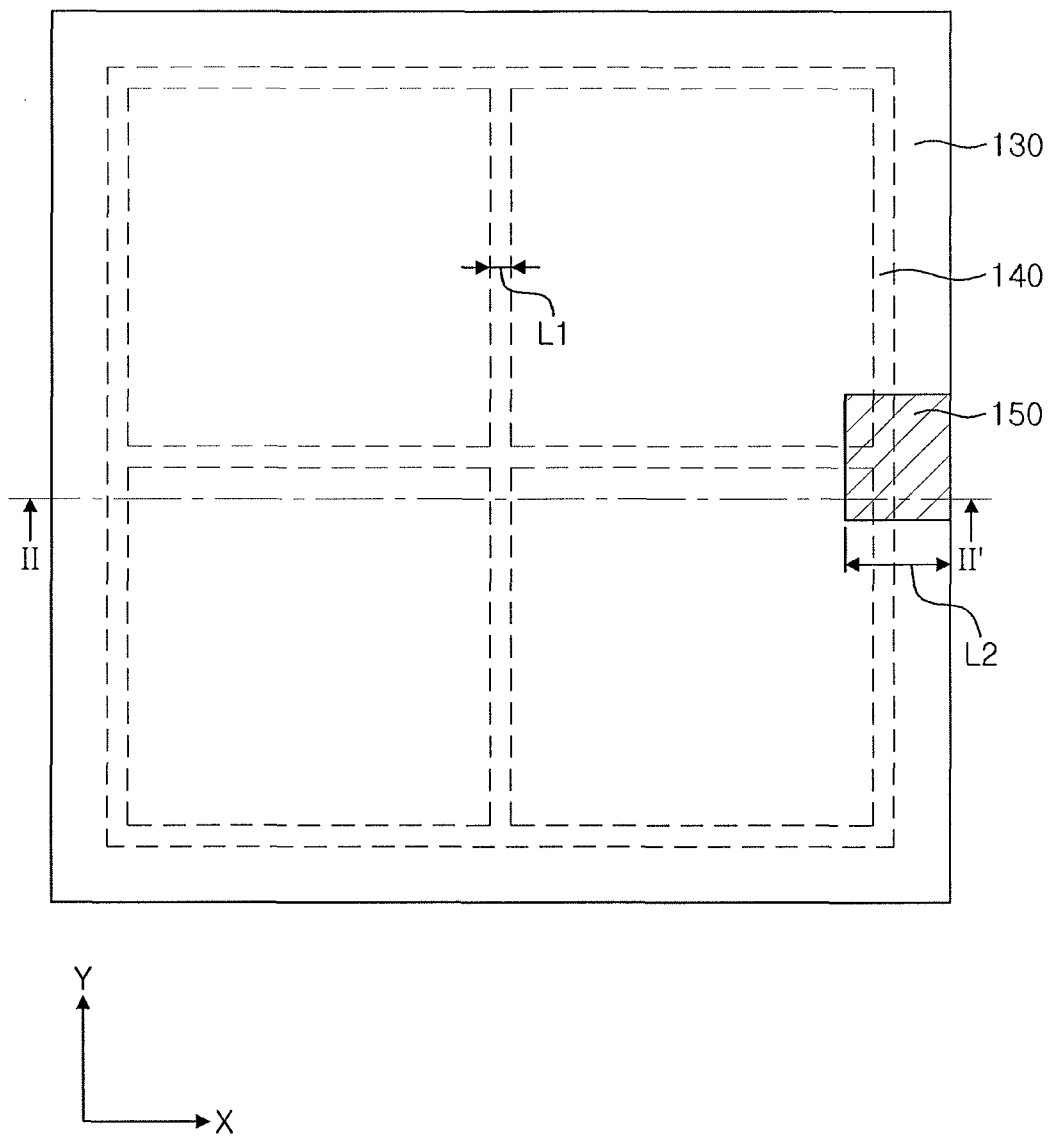
FIG. 1 illustrates a schematic plan view of a semiconductor light emitting device according to an embodiment.

Embodiments will now be described in detail with reference to the accompanying drawings. The embodiments may, however, be exemplified in many different forms and should not be construed as being limited to the specific descriptions set forth herein. Rather, these embodiments are provided so that this disclosure will be thorough and complete, and will fully convey exemplary implementations to those skilled in the art.

In the drawings, the shapes and dimensions of elements may be exaggerated for clarity, and the same reference numerals will be used throughout to designate the same or like elements.

Figure 2:
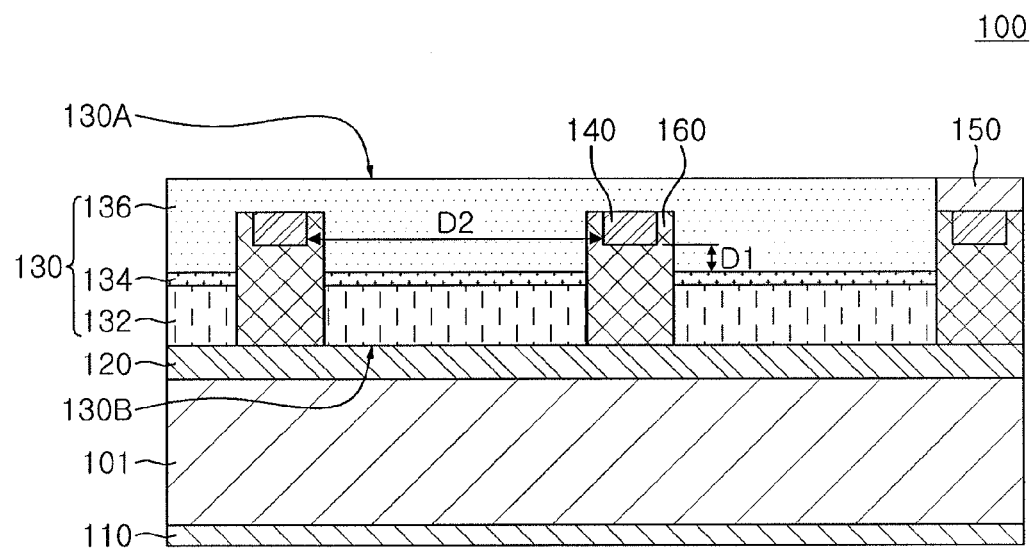
FIG. 2 illustrates a cross-sectional view taken along line II-II' of FIG. 1.

FIG. 1 illustrates a schematic plan view of a semiconductor light emitting device according to an embodiment, and FIG. 2 illustrates a cross-sectional view along line II-II' of FIG. 1. In order to facilitate understanding thereof, some elements including a second electrode 140 are enlarged in FIG. 2, relative to those depicted in FIG. 1.

With reference to FIGS. 1-2, a semiconductor light emitting device 100 may include a substrate 101 and a light emitting structure 130 formed on the substrate 101. The light emitting structure 130 may include a first conductivity type semiconductor layer 132, an active layer 134, and a second conductivity type semiconductor layer 136. In addition, the semiconductor light emitting device 100 may have an electrode structure including first and second electrodes 120 and 140, first and second pad electrodes 110 and 150, and an insulating part 160 covering bottom and lateral surfaces of the second electrode 140.

The substrate 101 together with the first electrode 120 may serve as an electrode of the semiconductor light emitting device 100, and may be formed of a conductive material. In addition, the substrate 101 may serve as a support during a laser lift off process for removal of a semiconductor growth substrate in a process of manufacturing the semiconductor light emitting device 100 to be described later with reference to FIGS. 9A through 9J. The substrate 101 may be formed of at least one of, e.g., gold (Au), nickel (Ni), aluminum (Al), copper (Cu), tungsten (W), silicon (Si), selenium (Se), germanium (Ge), gallium nitride (GaN), and gallium arsenic (GaAs). For example, the substrate 101 may be formed of silicon (Si) doped with aluminum (Al). In this case, the substrate 101 may be formed by plating, bonding or the like according to a selected material.

The light emitting structure 130 may include the first conductivity type semiconductor layer 132, the active layer 134, and the second conductivity type semiconductor layer 136 sequentially stacked on the substrate 101. A upper surface 130A of the light emitting structure 130 may be provided as a light emitting surface of light emitted from the active layer 134, and a lower surface 130B of the light emitting structure 130 may be disposed in a direction toward a packaging substrate.

For example, the first and second conductivity type semiconductor layers 132 and 136 may be formed of semiconductors doped with p-type and n-type impurities, respectively. In another example, the first and second conductivity type semiconductor layers 132 and 136 may be formed of semiconductors doped with n-type and p-type impurities, respectively. In one example, the first and second conductivity type semiconductor layers 132 and 136 are formed of nitride semiconductors expressed by a composition of $Al_xIn_yGa_{1-x-y}N$ ($0 \le x \le 1$, $0 \le y \le 1$, $0 < x+y \le 1$). The materials of the first and second conductivity type semiconductor layers 132 and 136 are not particularly limited, and AlGaInP semiconductors, AlGaAs semiconductors or the like may also be used therefor.

The active layer 134 is interposed between the first and second conductivity type semiconductor layers 132 and 136, and emits light having a predetermined level of energy through electron-hole recombination. The active layer 134 may include a material having an energy band gap less than that of the first and second conductivity type semiconductor layers 132 and 136. For example, when the first and second conductivity type semiconductor layers 132 and 136 are formed of GaN-based compound semiconductors, the active layer 134 may include InAlGaN-based compound semiconductors having an energy band gap less than that of the GaN-based compound semiconductors. In addition, the active layer 134 may have a multi-quantum well (MQW) structure in which quantum well layers and quantum barrier layers are alternately laminated. For example, a InGaN/GaN structure may be used.

The first and second electrodes 120 and 140 may be contact layers for external electrical connections and may be connected to the first and second conductivity type semiconductor layers 132 and 136, respectively. The first and second electrodes 120 and 140 may be disposed in opposite directions based on the active layer 134.

The first electrode 120 may be disposed below the light emitting structure 130 and may be electrically connected to the substrate 101.

The second electrode 140 may be embedded within the light emitting structure 130. In the present embodiment, the second electrode 140 may be disposed within the second conductivity type semiconductor layer 136. The second electrode 140 may be spaced apart from a top surface of the active layer 134 by a predetermined distance D1. In this case, electrical separation of the second electrode 140 from the first conductivity type semiconductor layer 132 may be stabilized. As shown in FIG. 1, the second electrode 140 may be formed as lines extended to be rows and columns in x and y directions, and the rows and columns may be connected to one another within the semiconductor light emitting device 100 to have a certain pattern. However, the connection structure and the connection pattern depicted in FIG. 1 are merely exemplary, and the second electrode 140 is not limited thereto. For example, a distance D2 between adjacent columns of the second electrode 140 may be varied.

The first and second electrodes 120 and 140 may have a single layer structure or a multilayer structure formed of a conductive material having ohmic properties with the first and second conductivity type semiconductor layers 132 and 136. For example, the first and second electrodes 120 and 140 may include at least one of, e.g., Au, Ag, Cu, Zn, Al, In, Ti, Si, Ge, Sn, Mg, Ta, Cr, W, Ru, Rh, Ir, Ni, Pd, Pt and alloys thereof. In particular, the first and second electrodes 120 and 140 may be formed of a light reflective material having a high level of reflectivity, e.g., an AgPdCu alloy.

The insulating part 160 may electrically separate the second electrode 140 from the first conductivity type semiconductor layer 132, the active layer 134, and the first electrode 120. The insulating part 160 may be connected to the second electrode 140 by penetrating through the first conductivity type semiconductor layer 132 and the active layer 134, and may be extended along the second electrode 140 in the x and y directions on a plane. The insulating part 160 may be formed to cover the bottom and lateral surfaces of the second electrode 140.

The insulating part 160 may be formed of any material having electrically insulating properties. In addition, a material having a low degree of light absorption as well as having electrically insulating properties may be used. For example, the insulating part 160 may be formed of a silicon oxide or a silicon nitride, e.g., $SiO_2$, $SiO_xN_y$, $Si_xN_y$, or the like. In addition, spin on glass (SOG) may be used in order to obtain superior gap filling performance in the insulating part 160.

The first and second pad electrodes 110 and 150 may be connected to the first and second electrodes 120 and 140, respectively, such that they serve as external terminals of the semiconductor light emitting device 100. The first and second pad electrodes 110 and 150 may be disposed in opposite directions based on the active layer 134, i.e., above and below the substrate 101.

The first pad electrode 110 may be disposed on a bottom surface of the substrate 101. The first pad electrode 110 may occupy a large area in order to obtain a superior heat dissipation effect.

The second pad electrode 150 may only be disposed on a portion of the second electrode 140, as illustrated in FIG. 1. A width L2 of the second pad electrode 150, e.g., along the x-axis, may be greater than that a width L1 of the second electrode 140, e.g., a width of a single column of the second electrode 140 along the x-axis, but embodiments are not limited thereto. The second pad electrode 150 may be disposed within the light emitting structure 130 while being exposed to the upper surface 130A of the light emitting structure 130, e.g., an upper surface of the second pad electrode 150 may be level with and define a portion of e upper surface 130A of the light emitting structure 130.

The first and second pad electrodes 110 and 150 may be formed to have a single layer structure or a multilayer structure. The first and second pad electrodes 110 and 150 may be formed of at least one of, e.g., Ag, Al, Ni, Cr, Pd, Cu, Pt, Sn, W, Au, Rh, Ir, Ru, Mg, Zn and alloys thereof. For example, the first pad electrode 110 may be formed of a eutectic metal, e.g., AuSn, CuSn or the like, and the first pad electrode 110 may be bonded by eutectic bonding when the semiconductor light emitting device 100 is mounted in a package or the like. For example, the second pad electrode 150 may be formed of Au, Al, or alloys thereof.

In the semiconductor light emitting device 100 according to the present embodiment, the second electrode 140 may not be exposed to the upper surface 130A, i.e., to the light emitting surface, of the light emitting structure 130, but may be embedded within the light emitting structure 130. In other words, as illustrated in FIG. 2, an upper surface of the second electrode 140 may be lower than the upper surface 130A relative to the first electrode 120, e.g., a distance between the upper surface of the second electrode 140 and the first electrode 120 may be smaller than a distance between the upper surface 130A and the first electrode 120. As such, the, e.g., entire, upper surface of the second electrode 140, e.g., upper surfaces of all rows and columns defining the second electrode 140, may be covered by a portion of the second conductivity type semiconductor layer 136. Therefore, loss of light due to light absorbed by the second electrode 140 may be reduced, so light extraction efficiency in the light emitting surface may be improved. The semiconductor light emitting device 100 according to the present embodiment exhibits a light extraction efficiency of about 54.2%, while a vertical-type semiconductor light emitting device including electrodes and pad electrodes having a same size as those of the present embodiment exhibit a light extraction efficiency of about 50.7%, whereby it could be appreciated that the light extraction efficiency is improved.

Figure 3:
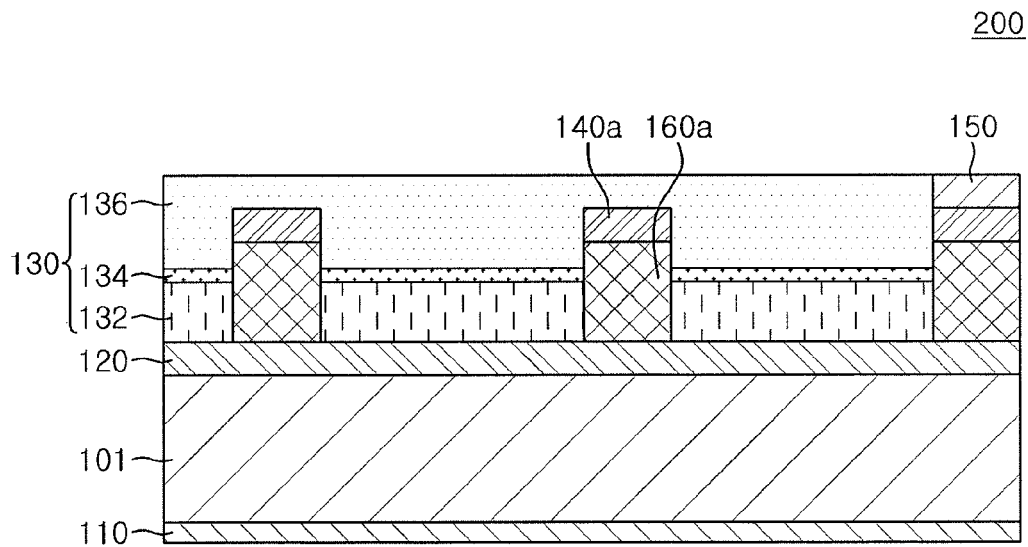
FIG. 3 illustrates a schematic cross-sectional view of a semiconductor light emitting device according to an embodiment.

FIG. 3 illustrates a schematic cross-sectional view of a semiconductor light emitting device according to another embodiment. In the following descriptions, same elements are denoted by same reference numerals as used in FIGS. 1 and 2, and a repeated description thereof will be omitted.

With reference to FIG. 3, a semiconductor light emitting device 200 may include the light emitting structure 130 formed on the substrate 101, the light emitting structure 130 including the first conductivity type semiconductor layer 132, the active layer 134, and the second conductivity type semiconductor layer 136. In addition, the semiconductor light emitting device 200 may have an electrode structure including first and second electrodes 120 and 140a, the first and second pad electrodes 110 and 150, and an insulating part 160a in contact with a bottom surface of the second electrode 140a.

The first and second electrodes 120 and 140a may be disposed to be connected to the first and second conductivity type semiconductor layers 132 and 136. The first and second electrodes 120 and 140a may be disposed in opposite directions based on the active layer 134. The second electrode 140a may be embedded within the light emitting structure 130, i.e., the second electrode 140a may be disposed within the second conductivity type semiconductor layer 136. The second electrode 140a may be spaced apart from the top surface of the active layer 134 by a predetermined distance.

The insulating part 160a may electrically separate the second electrode 140a from the first conductivity type semiconductor layer 132, the active layer 134, and the first electrode 120. The insulating part 160a may penetrate through the first conductivity type semiconductor layer 132 and the active layer 134 to be connected to the second electrode 140a, and may be extended along the second electrode 140a on a plane. Unlike the semiconductor light emitting device 100 of FIG. 2, the insulating part 160a in the present embodiment may only be formed below the second electrode 140a.

Figure 4:
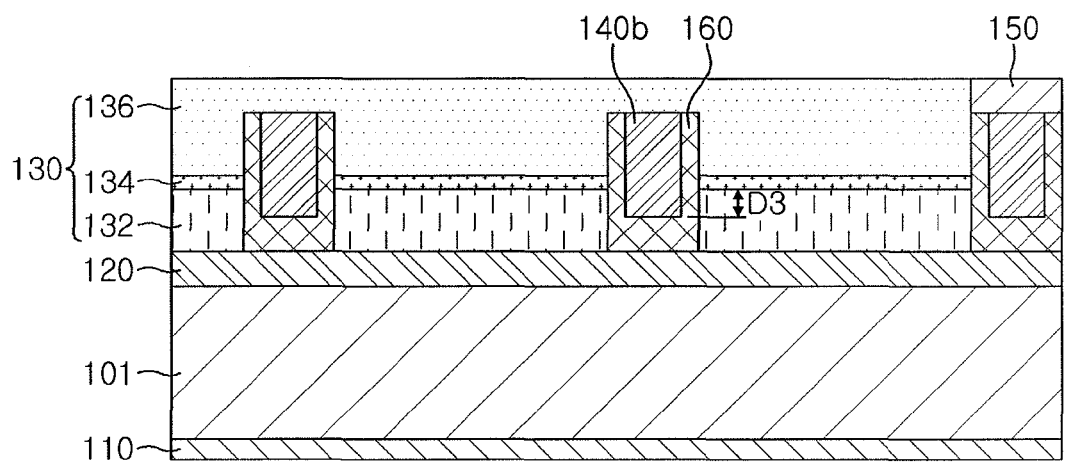
FIG. 4 illustrates a schematic cross-sectional view of a semiconductor light emitting device according to an embodiment.

FIG. 4 illustrates a schematic cross-sectional view of a semiconductor light emitting device according to another embodiment.

With reference to FIG. 4, a semiconductor light emitting device 300 may include the light emitting structure 130 formed on the substrate 101, the light emitting structure including the first conductivity type semiconductor layer 132, the active layer 134, and the second conductivity type semiconductor layer 136. In addition, the semiconductor light emitting device 300 may have an electrode structure including first and second electrodes 120 and 140b, the first and second pad electrodes 110 and 150, and the insulating part 160 covering bottom and lateral surfaces of the second electrode 140b.

The first and second electrodes 120 and 140b may be disposed to be connected to the first and second conductivity type semiconductor layers 132 and 136. The second electrode 140b may be embedded in the light emitting structure 130. In particular, unlike the semiconductor light emitting device 100 of FIG. 2, the bottom surface of the second electrode 140b in the present embodiment may be extended below, i.e., downwardly of, the active layer 134. Therefore, the bottom surface of the second electrode 140b may be located below a bottom surface of the active layer 134 in a direction toward the substrate 101 by a predetermined distance D3.

Figure 5:
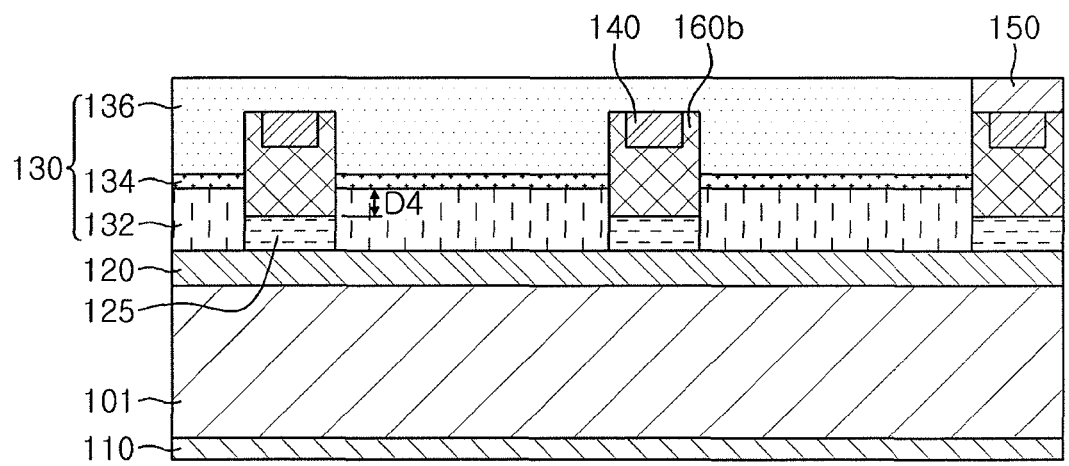
FIG. 5 illustrates a schematic cross-sectional view of a semiconductor light emitting device according to an embodiment.

FIG. 5 illustrates a schematic cross-sectional view of a semiconductor light emitting device according to another embodiment.

With reference to FIG. 5, a semiconductor light emitting device 400 may include the light emitting structure 130 formed on the substrate 101, the light emitting structure 130 including the first conductivity type semiconductor layer 132, the active layer 134, and the second conductivity type semiconductor layer 136. In addition, the semiconductor light emitting device 400 may have an electrode structure including the first and second electrodes 120 and 140, the first and second pad electrodes 110 and 150, and an insulating part 160b covering the bottom and lateral surfaces of the second electrode 140.

The first and second electrodes 120 and 140 may be disposed to be connected to the first and second conductivity type semiconductor layers 132 and 136. The first and second electrodes 120 and 140 may be disposed in opposite directions based on the active layer 134.

The insulating part 160b may electrically separate the second electrode 140 from the first conductivity type semiconductor layer 132, the active layer 134, the first electrode 120, and a first electrode extension part 125. The insulating part 160b may be connected to the second electrode 140 by penetrating through a portion of the first conductivity type semiconductor layer 132 and the active layer 134, and may be extended along the second electrode 140 on the plane.

In the present embodiment, the first electrode extension part 125 may be further disposed between the first electrode 120 and the insulating part 160b. The first electrode extension part 125 may be integrated with the first electrode 120. The first electrode extension part 125 may increase a contact area with the first conductivity type semiconductor layer 132. The first electrode extension part 125 may be spaced apart from the active layer 134 by a predetermined distance D4.

The first electrode extension part 125 may be formed of at least one of, e.g., silver (Ag), aluminum (Al), nickel (Ni), chrome (Cr), palladium (Pd), copper (Cu), platinum (Pt), and titanium (Ti). The first electrode extension part 125 and the first electrode 120 may be formed of the same material or different materials.

Figure 6:
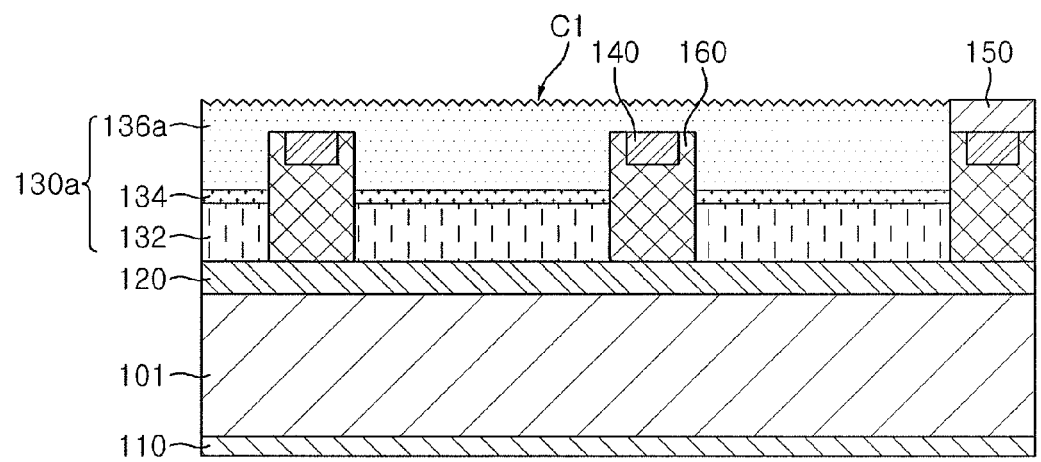
FIG. 6 illustrates a schematic cross-sectional view of a semiconductor light emitting device according to an embodiment.

FIG. 6 illustrates a schematic cross-sectional view of a semiconductor light emitting device according to another embodiment.

With reference to FIG. 6, a semiconductor light emitting device 500 may include a light emitting structure 130a formed on the substrate 101, the light emitting structure 130a including the first conductivity type semiconductor layer 132, the active layer 134, and a second conductivity type semiconductor layer 136a. In addition, the semiconductor light emitting device 500 may have an electrode structure including the first and second electrodes 120 and 140, the first and second pad electrodes 110 and 150, and the insulating part 160 covering the bottom and lateral surfaces of the second electrode 140.

A first unevenness structure C1 may be formed on a top surface of the second conductivity type semiconductor layer 136a. The first unevenness structure C1 may be formed by dry etching or wet etching. In particular, in the case of using wet etching, KOH or NaOH may be used, and the first unevenness structure C1 may be formed as an irregular unevenness structure in terms of size, shape, interval, or the like. Since the first unevenness structure C1 allows a path of light emitted from the active layer 134 to be varied, a light absorption rate inside the light emitting structure 130a may be reduced and a light scattering rate may be increased, whereby light extraction efficiency may be improved.

Although not shown, a passivation layer may be further formed on the second conductivity type semiconductor layer 136a. The passivation layer may serve as a protective layer, and may include, e.g., a silicon oxide film or a silicon nitride film.

Figure 7:
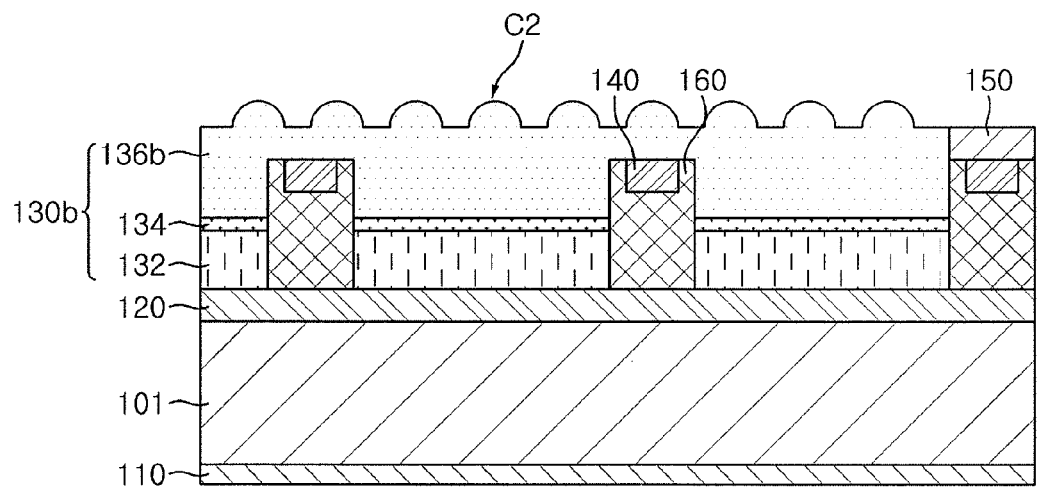
FIG. 7 illustrates a schematic cross-sectional view of a semiconductor light emitting device according to an embodiment.

FIG. 7 illustrates a schematic cross-sectional view of a semiconductor light emitting device according to another embodiment.

With reference to FIG. 7, a semiconductor light emitting device 600 may include a light emitting structure 130b formed on the substrate 101, the light emitting structure 130b including the first conductivity type semiconductor layer 132, the active layer 134, and a second conductivity type semiconductor layer 136b. In addition, the semiconductor light emitting device 600 may have an electrode structure including the first and second electrodes 120 and 140, the first and second pad electrodes 110 and 150, and the insulating part 160 covering the bottom and lateral surfaces of the second electrode 140.

A second unevenness structure C2 may be formed on a top surface of the second conductivity type semiconductor layer 136b. The second unevenness structure C2 may have an inclined lateral surface including a convex portion larger than that of the first unevenness structure C1 of the semiconductor light emitting device 500 of FIG. 6. The second unevenness structure C2 may be obtained by forming a pattern on a growth substrate (not shown) used for the growth of the second conductivity type semiconductor layer 136b and then growing the second conductivity type semiconductor layer 136b. The second unevenness structure C2 may improve light output characteristics. The semiconductor light emitting device 100 of FIG. 2 exhibited a light output of about 117 mW, while the semiconductor light emitting device 600 in the present embodiment exhibited an increased light output of about 305 mW, i.e., greater than two times that of the semiconductor light emitting device 100 of FIG. 2.

According to embodiments, the second unevenness structure C2 may be formed of a heterogeneous material having a different refractive index from that of the second conductivity type semiconductor layer 136b. In this case, an effect of changing the direction of light may be maximized due to difference in refractive index between the heterogeneous materials forming the second conductivity type semiconductor layer 136b and the second unevenness structure C2. In this case, the heterogeneous material forming the second unevenness structure C2 may be a transparent conductor or a transparent insulator.

Figure 8:
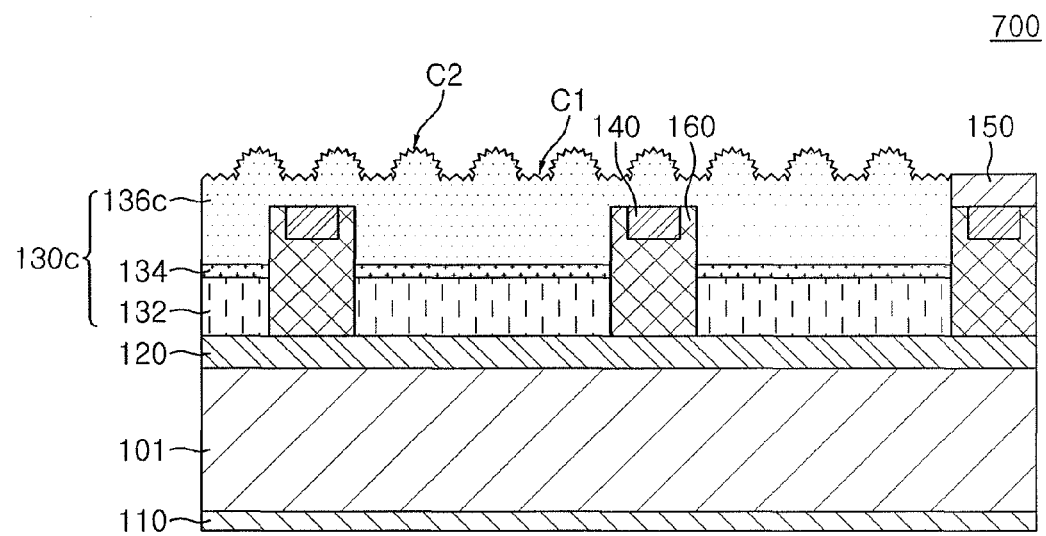
FIG. 8 illustrates a schematic cross-sectional view of a semiconductor light emitting device according to an embodiment.

FIG. 8 illustrates a schematic cross-sectional view of a semiconductor light emitting device according to another embodiment.

With reference to FIG. 8, a semiconductor light emitting device 700 may include a light emitting structure 130c formed on the substrate 101, the light emitting structure 130c including the first conductivity type semiconductor layer 132, the active layer 134, and a second conductivity type semiconductor layer 136c. In addition, the semiconductor light emitting device 700 may have an electrode structure including the first and second electrodes 120 and 140, the first and second pad electrodes 110 and 150, and the insulating part 160 covering the bottom and lateral surfaces of the second electrode 140.

A double unevenness structure including the first unevenness structure C1 and the second unevenness structure C2 may be formed on a top surface of the second conductivity type semiconductor layer 136c. The second unevenness structure C2 may be formed by the semiconductor growth process using the growth substrate as described above with reference to FIG. 7, and then the first unevenness structure C1 may be formed by the etching process as described above with reference to FIG. 6. The double unevenness structure may further improve light output characteristics. The semiconductor light emitting device 600 of FIG. 7 exhibited a light output of about 305 mW, while the semiconductor light emitting device 700 in the present embodiment exhibited an increased light output of about 354 mW.

FIGS. 9A through 9J illustrate schematic cross-sectional views of stages in a method of manufacturing a semiconductor light emitting device according to an embodiment. It is noted that while FIGS. 9A through 9J illustrate a process of manufacturing the semiconductor light emitting device 100 of FIGS. 1-2, the semiconductor light emitting devices of FIGS. 3-8 may be manufactured in a similar manner.

Figure 9A:
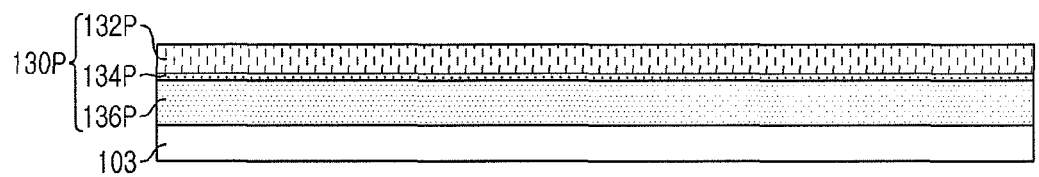
FIGS. 9A through 9J illustrate schematic cross-sectional views of stages in a method of manufacturing a semiconductor light emitting device according to an embodiment.

With reference to FIG. 9A, a light emitting structure 130P may be formed on a growth substrate 103.

A second conductivity type semiconductor layer 136P, an active layer 134P, and a first conductivity type semiconductor layer 132P may be sequentially grown on the growth substrate 103 by Metal Organic Chemical Vapor Deposition (MOCVD), hydride vapor phase epitaxy (HVPE), or the like, thereby forming a semiconductor laminated body.

The growth substrate 103 may be formed of insulating, conductive, or semiconductor materials, e.g., sapphire, $MgAl_2O_4$, MgO, $LiAlO_2$, $LiGaO_2$, GaN or the like. A sapphire substrate is formed of a crystal having Hexa-Rhombo R3c symmetry, and has a lattice constant of 13.001 Å on a C-axis and a lattice constant of 4.758 Å on an A-axis. Orientation planes of the sapphire substrate include a C (0001) plane, an A (1120) plane, an R (1102) plane, and the like. In particular, the C plane is mainly used as a substrate for nitride growth as it facilitates the growth of a nitride film and is stable at high temperatures.

Meanwhile, as shown in FIGS. 7 and 8, in the case in which the growth substrate 103 having an unevenness structure is used, a plurality of unevenness structures may be formed on a top surface of the second conductivity type semiconductor layer 136.

Figure 9B:
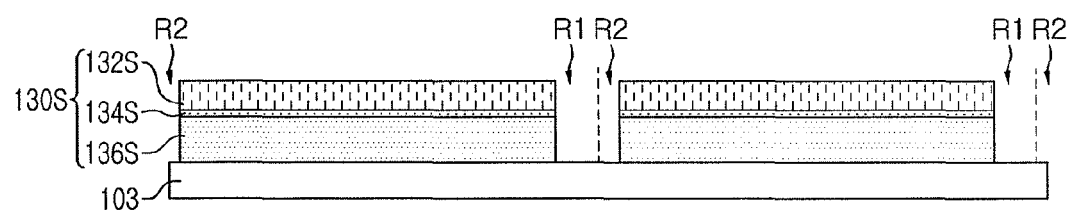

With reference to FIG. 9B, first and second regions R1 and R2 may be formed. The first region R1 may correspond to a region for forming the second pad electrode 150 of FIGS. 1 and 2. The second region R2 may be a region for division of individual light emitting devices, corresponding to a circumferential region of the semiconductor light emitting device 100 of FIG. 1 in chip units. According to embodiments, the formation of the second region R2 may be omitted.

The first and second regions R1 and R2 may be formed by etching the light emitting structure 130P of FIG. 9A using reactive ion etching (RIE) or the like, thereby allowing portions of the growth substrate 103 corresponding thereto to be exposed. A plurality of light emitting structures 130S in chip units may be formed.

Figure 9C:
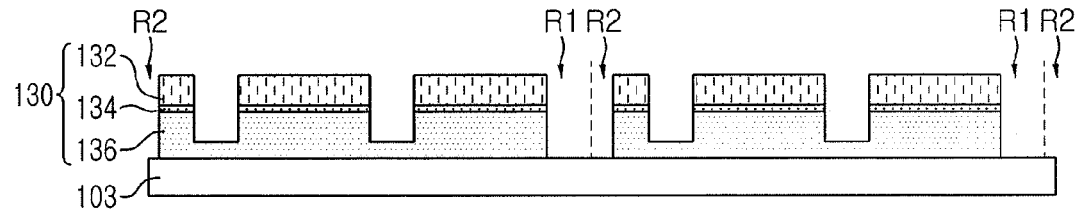

With reference to FIG. 9C, portions of the second conductivity type semiconductor layer 136, the active layer 134, and the first conductivity type semiconductor layer 132 may be etched to allow a portion of the second conductivity type semiconductor layer 136 to be exposed. The exposed region of the second conductivity type semiconductor layer 136 may correspond to a region for formation of the second electrode 140. Here, an etching process such as reactive ion etching (RIE) or the like may be used.

Figure 9D:
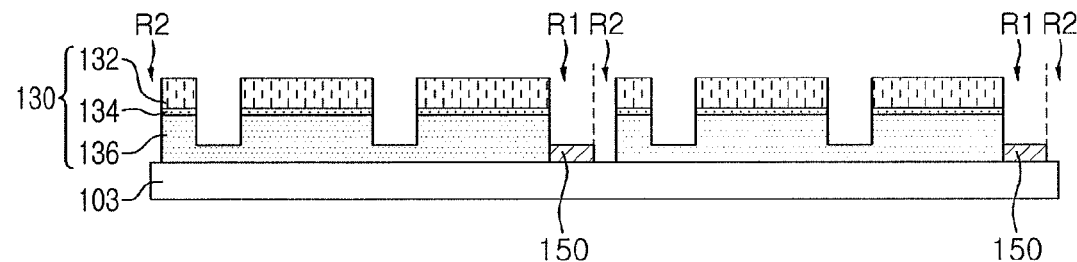

With reference to FIG. 9D, the second pad electrode 150 may be formed in the first region R1. The second pad electrode 150 may be formed by depositing a conductive material by physical vapor deposition (PVD), e.g., sputtering, thermal evaporation, or the like.

The second pad electrode 150 may only be formed in the first region R1 using a mask layer (not shown) at the time of the deposition process. In addition, for the formation of the second electrode 140 to be described below with reference to FIG. 9F, the second pad electrode 150 may be deposited to have a thickness equal to or similar to a level of the exposed region of the second conductivity type semiconductor layer 136.

Figure 9E:
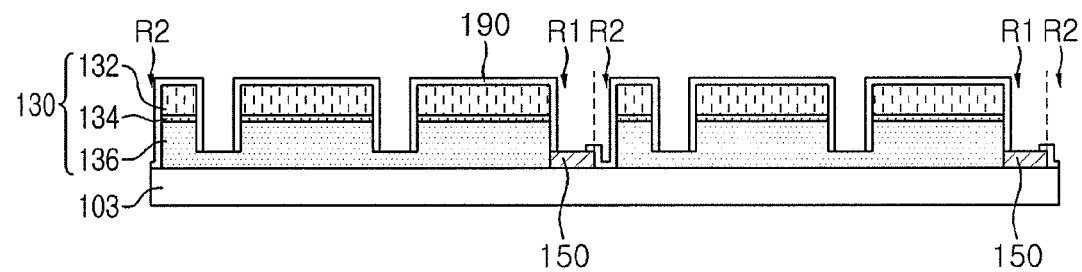
Figure 9F:
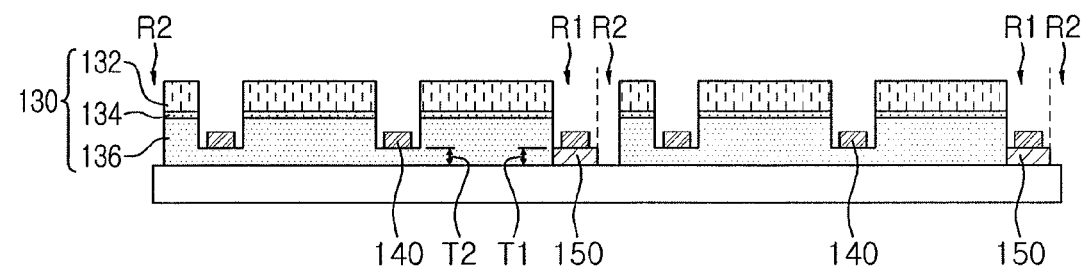

With reference to FIGS. 9E and 9F, the second electrode 140 may be formed. As shown in FIG. 9E, a mask layer 190 may be formed and patterned to allow a region, in which the second electrode 140 is to be formed, to be exposed. Then, a conductive material may be deposited and the mask layer 190 may be removed, and thus, the second electrode 140 may be formed as shown in FIG. 9F. A top surface of the second electrode 140 may be located to be lower than the active layer 134.

According to embodiments, the second electrode 140 may be formed of the same material as that of the second pad electrode 150. In addition, in the case in which the mask layer 190 is formed to reveal the entire exposed region of the second conductivity type semiconductor layer 136, i.e., when the mask layer 190 is only formed on a mesa region of the light emitting structure 130, the second electrode 140 may be formed like the second electrode 140a of the semiconductor light emitting device 200 of FIG. 3.

According to embodiments, when a thickness T1 of the second pad electrode 150 is not equal to a thickness T2 of the etched portion of the second conductivity type semiconductor layer 136, the top surface of the second electrode 140 formed on the second pad electrode 150 and the top surface of the second electrode 140 formed on the second conductivity type semiconductor layer 136 may have different heights.

Figure 9G:
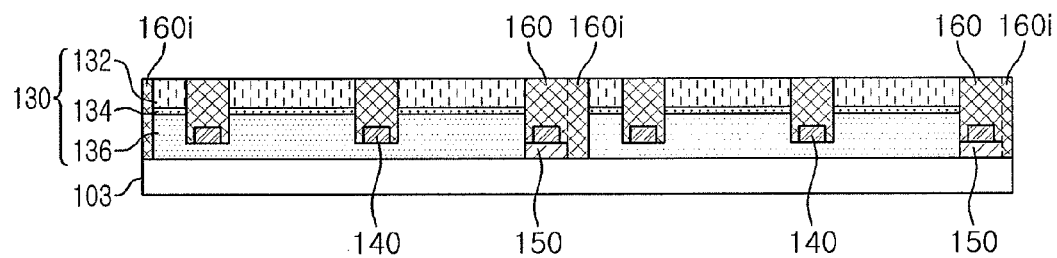

With reference to FIG. 9G, the insulating part 160 and a division part 160i may be formed. The insulating part 160 may electrically separate the second electrode 140 from the first conductivity type semiconductor layer 132, the active layer 134, and the first electrode 120 of FIG. 2. The division part 160i may protect the active layer 134 exposed to edges of the chip.

The insulating part 160 and the division part 160i may be simultaneously formed of the same insulating material. When the insulating material is deposited on the first conductivity type semiconductor layer 132, it may be removed using a planarization process or the like.

Figure 9H:
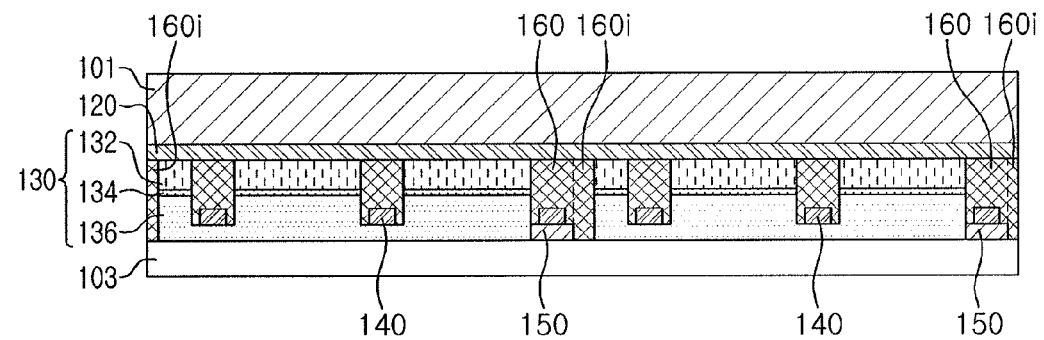

With reference to FIG. 9H, the first electrode 120 and the substrate 101 may be formed.

The first electrode 120 may be formed on the entirety of the light emitting structure 130 and the insulating part 160. The first electrode 120 may be formed of a light reflective material.

Then, the substrate 101 may be formed on the first electrode 120. The substrate 101 may be bonded using eutectic bonding, paste bonding, or the like. A bonding metallic layer (not shown) may be interposed between the first electrode 120 and the substrate 101.

Figure 9I:
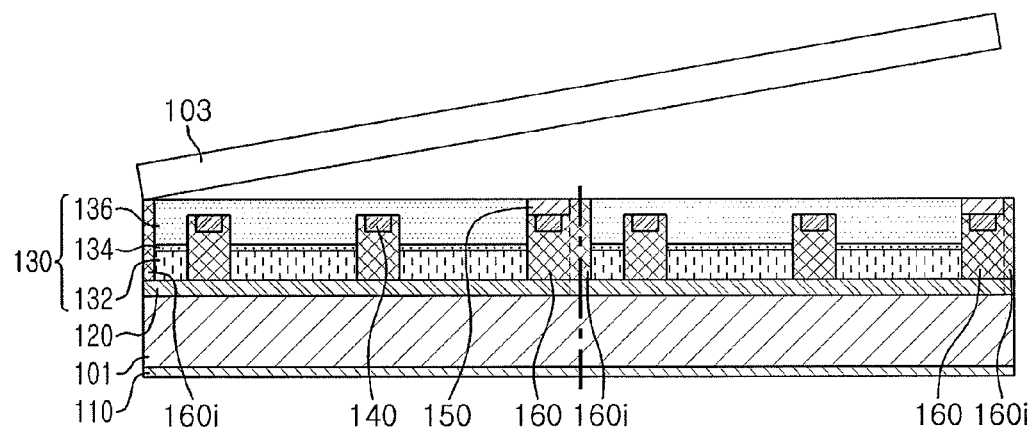

With reference to FIG. 9I, the growth substrate 103 may be removed. FIG. 9I is an inverted view of FIG. 9H.

The growth substrate 103 may be removed by a chemical process, e.g., etching or the like, or a physical process, e.g., grinding or the like. Alternatively, the growth substrate 103 may be removed by a laser lift off process in a manner such that an interface between the growth substrate 103 and the light emitting structure 130 is irradiated with a laser.

Figure 9J:
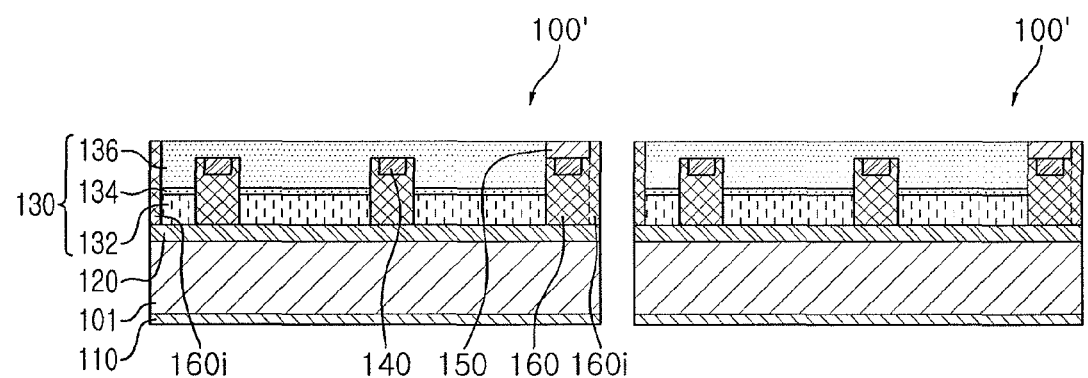

With reference to FIG. 9J, the laminated body may be divided into individual devices. The laminated body may be cut in the division part 160i along an alternated long and short dash line of FIG. 9I to be divided into individual semiconductor light emitting devices 100', followed by a packaging process. The cutting process may be performed using laser scribing or sawing.

Finally, the semiconductor light emitting device 100 of FIGS. 1 and 2 may be manufactured. The semiconductor light emitting device 100' of FIG. 9J is illustrated along with the division part 160i, an optional element which is not illustrated in FIGS. 1 and 2.

According to embodiments, prior to the division process, a protective layer or a wavelength conversion layer including a phosphor may be further formed on the surface of the light emitting structure 130.

Figure 10:
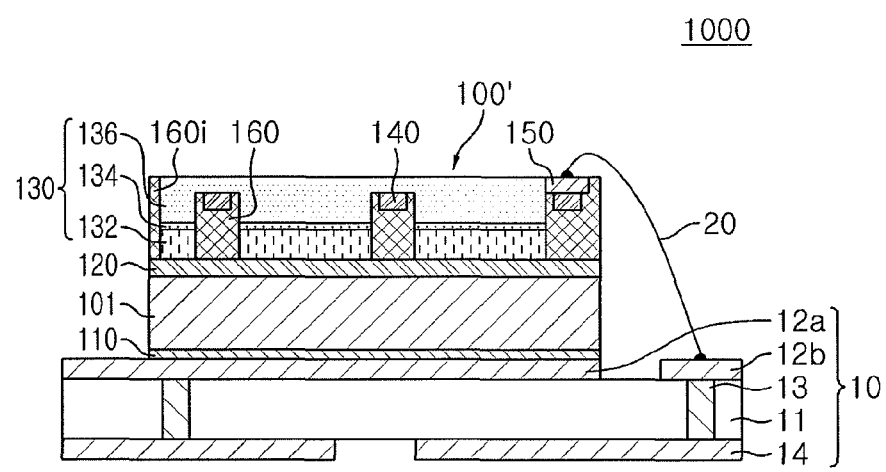
FIG. 10 illustrates an example of a package with a semiconductor light emitting device according to an embodiment.

FIG. 10 illustrates an example of applying a semiconductor light emitting device according to an embodiment to a package.

With reference to FIG. 10, a light emitting device package 1000 may include a mounting substrate 10 and the semiconductor light emitting device 100' mounted on the mounting substrate 10. Here, the semiconductor light emitting device 100' may have the above-described structure.

The mounting substrate 10 may include a substrate main body 11, first and second top surface electrodes 12a and 12b, and bottom surface electrodes 14. In addition, the mounting substrate 10 may include through electrodes 13 connecting the first and second top surface electrodes 12a and 12b to the bottom surface electrodes 14. Such a structure of the mounting substrate 10 is merely exemplary, and various structures may be employed. In addition, the mounting substrate 10 may be provided as a substrate, e.g., a ceramic substrate formed of AlN, $Al_2O_3$ or the like, a printed circuit board (PCB), a metal core printed circuit board (MCPCB), a metal printed circuit board (MPCB), a flexible printed circuit board (FPCB) or the like, or may be provided as a pair of lead frames.

The first pad electrode 110 may be electrically connected to the first top surface electrode 12a and the second pad electrode 150 may be electrically connected to the second top surface electrode 12b by a conductive wire 20.

According to embodiments, a wavelength conversion part (not shown) converting a wavelength of light emitted from the semiconductor light emitting device 100' into a different wavelength may be further formed on the surface of the semiconductor light emitting device 100', and the wavelength conversion part may include a phosphor, a quantum dot, or the like.

Figure 11:
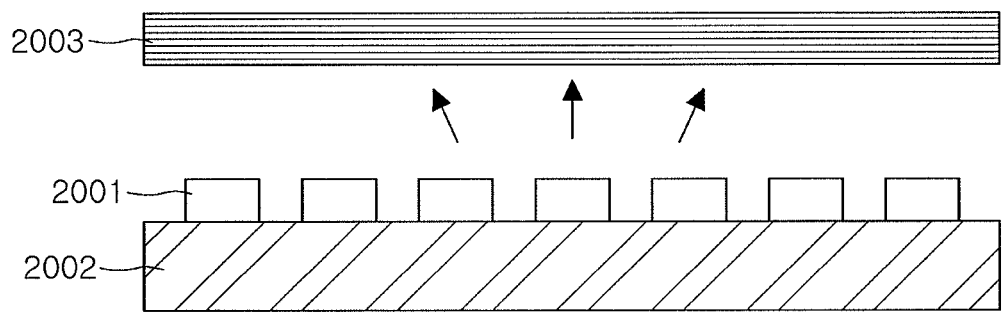
FIGS. 11 and 12 illustrate examples of backlight units with a semiconductor light emitting device according to an embodiment.
Figure 12:
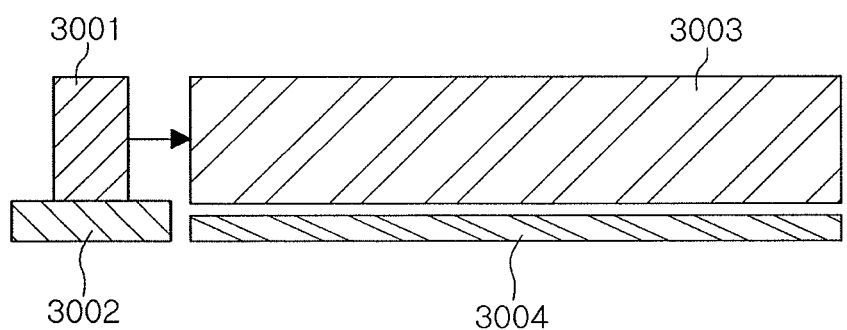

FIGS. 11 and 12 illustrate examples of applying a semiconductor light emitting device according to an embodiment to backlight units.

With reference to FIG. 11, a backlight unit 2000 may include a light source 2001 mounted on a substrate 2002 and at least one optical sheet 2003 disposed thereabove. The light source 2001 may be a light emitting device package having the above-described structure of FIG. 10 or a structure similar thereto. Alternatively, a semiconductor light emitting device may be directly mounted on the substrate 2002 in a chip-on-board (COB) scheme.

The light source 2001 in the backlight unit 2000 of FIG. 11 emits light toward a liquid crystal display (LCD) device disposed thereabove, whereas a light source 3001 mounted on a substrate 3002 in a backlight unit 3000 of FIG. 12 emits light laterally, i.e., the light is incident on a light guide plate 3003 of the backlight unit 3000 that serves as a surface light source. The light travelling to the light guide plate 3003 may be emitted upwardly and a reflective layer 3004 may be formed under a bottom surface of the light guide plate 3003 in order to improve light extraction efficiency.

Figure 13:
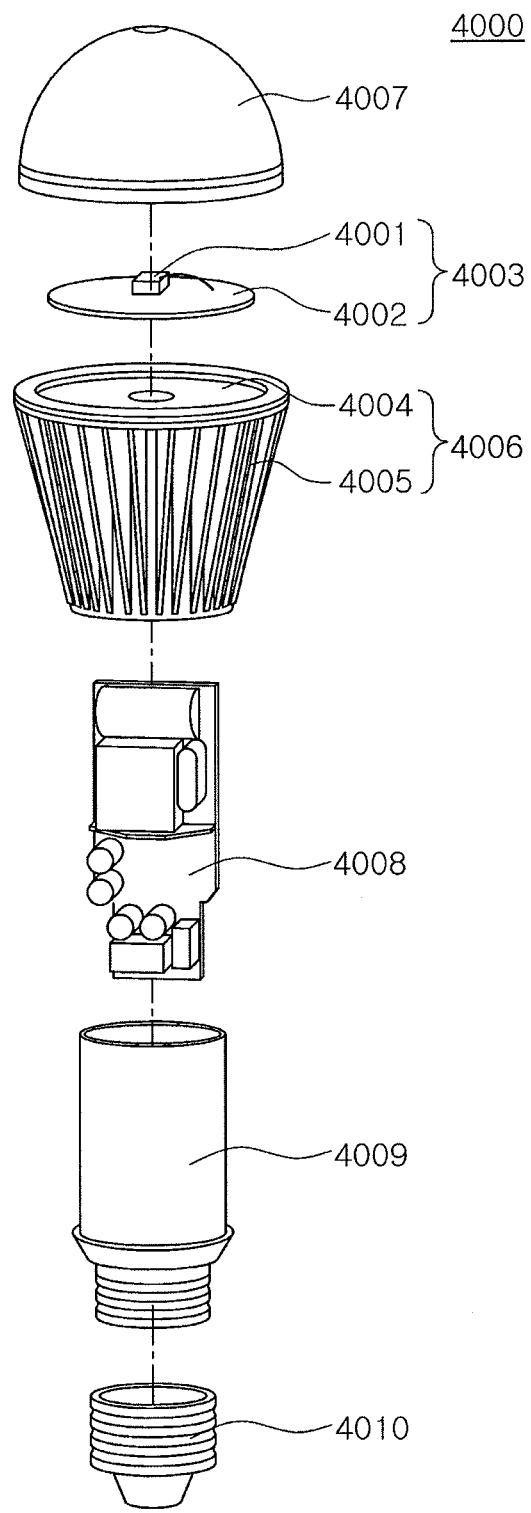
FIG. 13 illustrates an example of a lighting device with a semiconductor light emitting device according to an embodiment.

FIG. 13 illustrates an example of applying a semiconductor light emitting device according to an embodiment to a lighting device.

With reference to an exploded perspective view of FIG. 13, a lighting device 4000 is exemplified as a bulb-type lamp, and includes a light emitting module 4003, a driving unit 4008, and an external connector unit 4010. In addition, exterior structures such as an external housing 4006, an internal housing 4009, a cover unit 4007 and the like may be additionally included. The light emitting module 4003 may include a semiconductor light emitting device 4001 and a circuit board 4002 having the semiconductor light emitting device 4001 mounted thereon. In the present embodiment, a single semiconductor light emitting device 4001 is mounted on the circuit board 4002. However, if necessary, a plurality of semiconductor light emitting devices may be mounted thereon. In addition, the semiconductor light emitting device 4001 may be formed as a package and then mounted on the circuit board 4002, rather than being directly mounted thereon.

In the lighting device 4000, the light emitting module 4003 may include the external housing 4006 serving as a heat radiating part, and the external housing 4006 may include a heat sink plate 4004 in direct contact with the light emitting module 4003 to improve the dissipation of heat and heat-radiation fin 4005 surrounding lateral surface of the lighting device 4000. In addition, the lighting device 4000 may include the cover unit 4007 disposed above the light emitting module 4003 and having a convex lens shape. The driving unit 4008 may be disposed inside the internal housing 4009 and connected to the external connector unit 4010 such as a socket structure to receive power from an external power source. In addition, the driving unit 4008 may convert the received power into power appropriate for driving the semiconductor light emitting device 4001 of the light emitting module 4003 and supply the converted power thereto. For example, the driving unit 4008 may be provided as an AC-DC converter, a rectifying circuit part, or the like.

Figure 14:
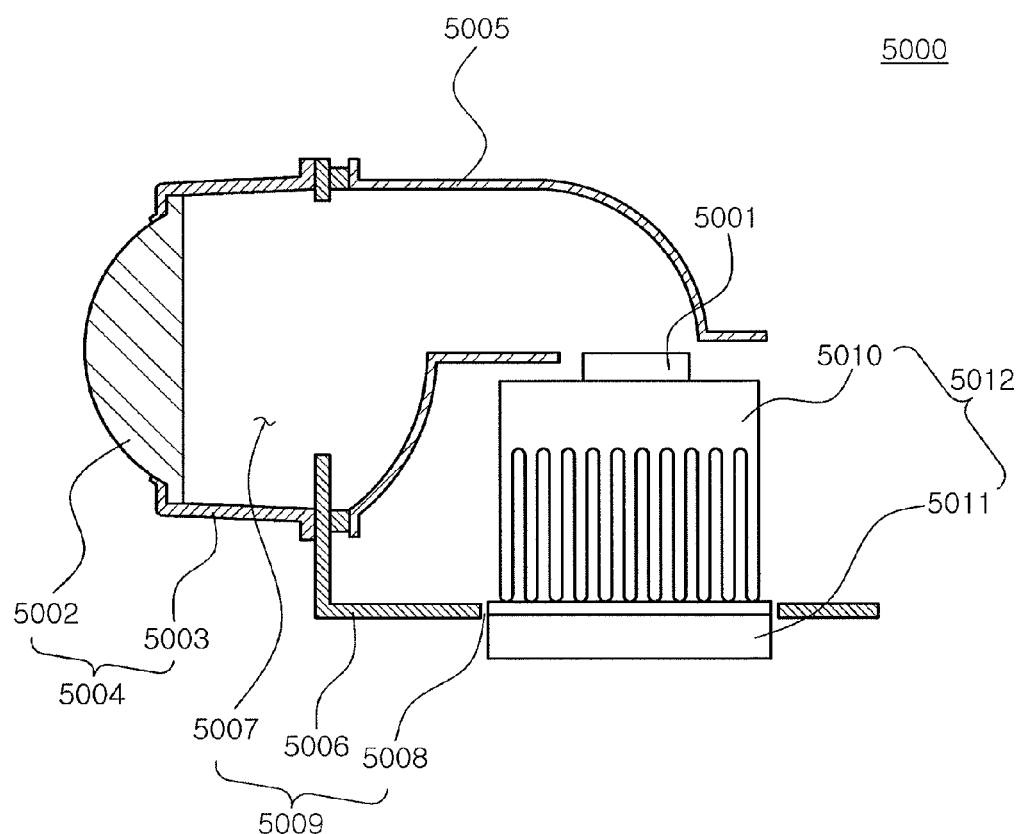
FIG. 14 illustrates an example of a headlamp with a semiconductor light emitting device according to an embodiment.

FIG. 14 illustrates an example of applying a semiconductor light emitting device according to an embodiment to a headlamp.

With reference to FIG. 14, a headlamp 5000 used in a vehicle or the like may include a light source 5001, a reflective unit 5005 and a lens cover unit 5004, the lens cover unit 5004 including a hollow guide part 5003 and a lens 5002. In addition, the head lamp 5000 may further include a heat radiating unit 5012 dissipating heat generated by the light source 5001 outwardly. The heat radiating unit 5012 may include a heat sink 5010 and a cooling fan 5011 in order to effectively dissipate heat. In addition, the headlamp 5000 may further include a housing 5009 allowing the heat radiating unit 5012 and the reflective unit 5005 to be fixed thereto and supporting them. One surface of the housing 5009 may be provided with a central hole 5008 into which the heat radiating unit 5012 is inserted to be coupled thereto. In addition, the other surface of the housing 5009 bent in a direction quadrangular to one surface of the housing 5009 may be provided with a forwardly open hole 5007 such that light generated by the light source 5001 may be reflected by the reflective unit 5005 disposed above the light source 5001, pass through the forwardly open hole 5007, and be emitted outwardly.

As set forth above, according to embodiments, a high output, large area semiconductor light emitting device having improved light extraction efficiency may be achieved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
    a light emitting structure including a first conductivity type semiconductor layer, an active layer, and a second conductivity type semiconductor layer;
    a first electrode disposed below the light emitting structure, the first electrode being electrically connected to the first conductivity type semiconductor layer;
    a second electrode within the light emitting structure, the second electrode being electrically connected to the second conductivity type semiconductor layer;
    an insulating part electrically separating the second electrode from the first conductivity type semiconductor layer, the active layer, and the first electrode;
    a first pad electrode electrically connected to the first electrode; and
    a second pad electrode electrically connected to the second electrode, the second pad electrode being within the light emitting structure and exposed through a top surface of the light emitting structure,
    wherein an upper surface of the second pad electrode is level with an upper surface of the second conductivity type semiconductor layer to define the exposed top surface of the light emitting structure, and the second pad electrode is on a portion of the second electrode.

2. The semiconductor light emitting device as claimed in claim 1, wherein the first pad electrode and the second pad electrode are disposed in opposite directions based on the active layer.

3. The semiconductor light emitting device as claimed in claim 1, wherein the first electrode and the second electrode are disposed at opposite surfaces of the active layer.

4. The semiconductor light emitting device as claimed in claim 1, wherein the second electrode is embedded within the second conductivity type semiconductor layer, an entirety of the second electrode being between upper and lower surfaces of the second conductivity type semiconductor layer.

5. The semiconductor light emitting device as claimed in claim 4, wherein a bottom surface of the second electrode is spaced apart from a top surface of the active layer along a direction normal to the first electrode.

6. The semiconductor light emitting device as claimed in claim 1, wherein the second electrode includes a plurality of lines extended as rows and columns.

7. The semiconductor light emitting device as claimed in claim 6, wherein the rows and columns of the second electrode are connected to one another within the light emitting structure.

8. The semiconductor light emitting device as claimed in claim 6, wherein the second pad is in direct contact with portions of the second electrode and of the insulating part, a total area of an upper surface of the second pad being smaller than a total area of an upper surface of the second electrode including the plurality of lines.

9. The semiconductor light emitting device as claimed in claim 1, wherein a width of the second pad electrode is greater than a width of the second electrode.

10. The semiconductor light emitting device as claimed in claim 1, wherein the insulating part penetrates through the first conductivity type semiconductor layer and the active layer and is connected to the second electrode.

11. The semiconductor light emitting device as claimed in claim 1, wherein the insulating part covers at least an entire bottom of the second electrode.

12. The semiconductor light emitting device as claimed in claim 1, further comprising a conductive substrate below the first electrode, the first pad electrode being below the conductive substrate.

13. The semiconductor light emitting device as claimed in claim 1, wherein the light emitting structure includes a first unevenness structure on the top surface thereof.

14. The semiconductor light emitting device as claimed in claim 13, wherein the light emitting structure includes a second unevenness structure on a top surface thereof, the second unevenness structure having a convex portion larger than a convex portion of the first unevenness structure.

15. The semiconductor light emitting device as claimed in claim 1, wherein a distance between an upper surface of the second electrode and the first electrode is smaller than a distance between an upper surface of the light emitting structure and the first electrode, the upper surface of the second electrode and the light emitting structure facing a same direction.

16. A semiconductor light emitting device, comprising:
    a light emitting structure including a first conductivity type semiconductor layer, an active layer, and a second conductivity type semiconductor layer sequentially stacked;
    a first electrode electrically connected to the first conductivity type semiconductor layer;

a second electrode within the light emitting structure, the second electrode being electrically connected to the second conductivity type semiconductor layer;

a first pad electrode electrically connected to the first electrode; and a second pad electrode electrically connected to the second electrode, the second pad electrode being within the light emitting structure and exposed through a top surface of the light emitting structure, wherein an upper surface of the second pad electrode is level with an upper surface of the second conductivity type semiconductor layer to define the exposed top surface of the light emitting structure, and the second pad electrode is on a portion of the second electrode.

17. A semiconductor light emitting device, comprising:

a light emitting structure including a first conductivity type semiconductor layer, an active layer, and a second conductivity type semiconductor layer;

a first electrode electrically connected to the first conductivity type semiconductor layer;

a second electrode within and electrically connected to the second conductivity type semiconductor layer, an entirety of the second electrode being between upper and lower surfaces of the second conductivity type semiconductor layer;

an insulating part electrically separating the second electrode from the first conductivity type semiconductor layer, the active layer, and the first electrode;

a first pad electrode electrically connected to the first electrode; and a second pad electrode electrically connected to the second electrode, the second pad electrode being within the light emitting structure and exposed through a top surface of the light emitting structure, wherein an upper surface of the second pad electrode is level with an upper surface of the second conductivity type semiconductor layer to define the exposed top surface of the light emitting structure, and the second pad electrode is on a portion of the second electrode.

18. The semiconductor light emitting device as claimed in claim 17, further comprising an electrode extension part extending from the first electrode toward the second electrode, the insulating part separating the electrode extension part from the active layer and a bottom of the second electrode.

19. The semiconductor light emitting device as claimed in claim 18, wherein the first conductivity type semiconductor layer separates adjacent portions of the electrode extension part.

* * * * *